(12) United States Patent
Kim et al.

(10) Patent No.: US 8,199,038 B2
(45) Date of Patent: Jun. 12, 2012

(54) ACTIVE RESISTANCE-CAPACITOR INTEGRATOR AND CONTINUOUS-TIME SIGMA-DELTA MODULATOR WITH GAIN CONTROL FUNCTION

(75) Inventors: Yi Gyeong Kim, Daejeon (KR); Min Hyung Cho, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 14 days.

(21) Appl. No.: 12/843,591

(22) Filed: Jul. 26, 2010

(65) Prior Publication Data
US 2011/0025537 A1    Feb. 3, 2011

(30) Foreign Application Priority Data

Jul. 28, 2009 (KR) .................. 10-2009-0068827
Jun. 16, 2010 (KR) .................. 10-2010-0056911

(51) Int. Cl.
*H03M 3/00* (2006.01)
(52) U.S. Cl. .................. 341/143; 327/344
(58) Field of Classification Search .......... 341/143
See application file for complete search history.

(56) References Cited

U.S. PATENT DOCUMENTS

| | | | |
|---|---|---|---|
| 6,462,615 B1 * | 10/2002 | Tanghe | 327/560 |
| 6,545,534 B1 * | 4/2003 | Mehr | 330/69 |
| 7,057,451 B2 * | 6/2006 | Lou et al. | 327/553 |
| 7,098,733 B1 * | 8/2006 | Lokere | 330/147 |
| 7,102,441 B2 * | 9/2006 | Lee et al. | 330/284 |
| 7,148,829 B2 | 12/2006 | Inukai | |
| 7,268,715 B2 | 9/2007 | Guimaraes | |
| 7,315,200 B2 | 1/2008 | Holberg et al. | |
| 7,352,238 B2 * | 4/2008 | Elwan et al. | 330/86 |
| 7,425,863 B2 * | 9/2008 | Gatta et al. | 327/558 |
| 7,821,341 B2 * | 10/2010 | Kim et al. | 330/284 |

FOREIGN PATENT DOCUMENTS

| KR | 1019960007655 B1 | 6/1996 |
|---|---|---|
| KR | 1020080087842 A | 10/2008 |

* cited by examiner

*Primary Examiner* — Khai M Nguyen (57) ABSTRACT

Provided are an active resistance-capacitance (RC) integrator and a continuous-time sigma-delta modulator, which have a gain control function. The active RC integrator includes an amplifier, a first base resistor connected between a first input node and a positive input port of the amplifier, a second base resistor connected between a second input node and a negative input port of the amplifier, a first resistor unit connected between the second input node and the positive input port of the amplifier, and a second resistor unit connected between the first input node and the negative input port of the amplifier. A resistor network including resistors and switches is configured to vary an input resistance, so that an active RC integrator may have a gain control function.

16 Claims, 4 Drawing Sheets

ACTIVE RESISTANCE-CAPACITOR INTEGRATOR AND CONTINUOUS-TIME SIGMA-DELTA MODULATOR WITH GAIN CONTROL FUNCTION

CROSS-REFERENCE TO RELATED APPLICATION

This application claims priority to and the benefit of Korean Patent Application Nos. 10-2009-0068827, filed Jul. 28, 2009, and 10-2010-0056911, filed Jun. 16, 2010, the disclosure of which is incorporated herein by reference in its entirety.

BACKGROUND

1. Field of the Invention

The present invention relates to an active resistance-capacitor (RC) integrator and a continuous-time sigma-delta modulator and, more particularly, to an active RC integrator and a continuous-time sigma-delta modulator, both of which have a gain control function.

2. Discussion of Related Art

In audio signal processing systems or wireless communication systems, an analog signal processing circuit has a signal gain control function and an analog-to-digital conversion function.

In general, the gain control function is realized by a variable gain amplifier (VGA) or a programmable gain amplifier (PGA), and the analog-to-digital function is realized by an analog-to-digital converter (ADC).

For example, the ADC may be a Nyquist ADC or a sigma-delta ADC using an oversampling technique. In recent years, with the advancement of integrated circuit (IC) processes, circuits can now operate at a high speed, and thus sigma-delta ADCs have shown a tendency toward broader applications.

In order to reduce the power consumption of an analog signal processing system, research has been conducted on techniques for integrating a gain control function and an analog-to-digital conversion function into a single circuit. As a result, techniques related to a sigma-delta modulator (or the analog block of a sigma-delta ADC) having a gain control function have been announced.

Hereinafter, the structure and gain control function of a conventional sigma-delta modulator will be described with reference to FIGS. 1 and 2.

Figure 1:
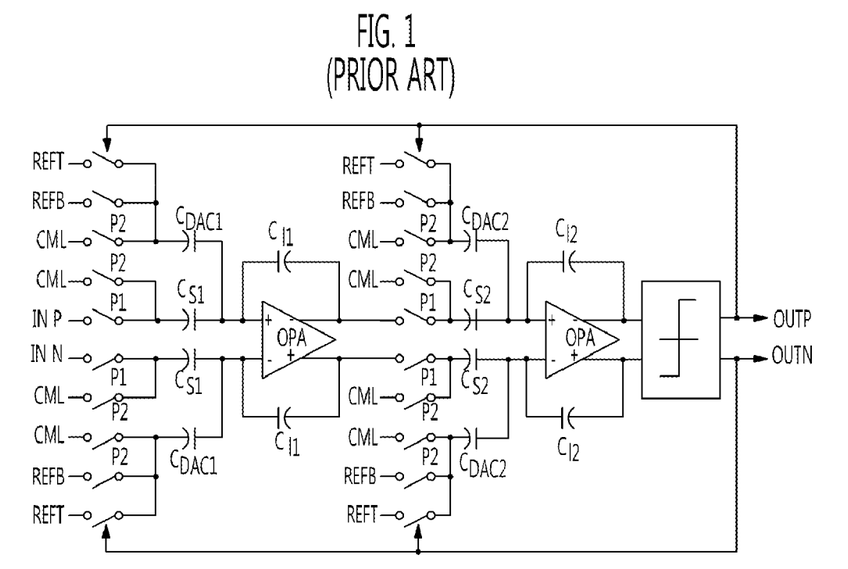
FIG. 1 is a circuit diagram illustrating a conventional discrete-time sigma-delta modulator having a gain control function.

FIG. 1 is a circuit diagram illustrating a conventional discrete-time sigma-delta modulator having a gain control function.

As illustrated, the conventional discrete-time sigma-delta modulator uses a method of storing and transmitting signals as charges in and to a capacitor using a switched-capacitor technique. Specifically, the conventional discrete-time sigma-delta modulator stores an input signal and a DAC signal, which is a feedback signal, as charges in the capacitor in the sampling phase of a clock, and transmits the sampled charges to an integral capacitor in an integral phase. The conventional discrete-time sigma-delta modulator may be embodied by an integrator and a DAC.

The discrete-time sigma-delta modulator having this structure can vary reference voltages REFT and REFB to control a gain. However, this structure can be applied to only the discrete-time sigma-delta modulator, and it cannot be applied to the continuous-time sigma-delta modulator.

Figure 2:
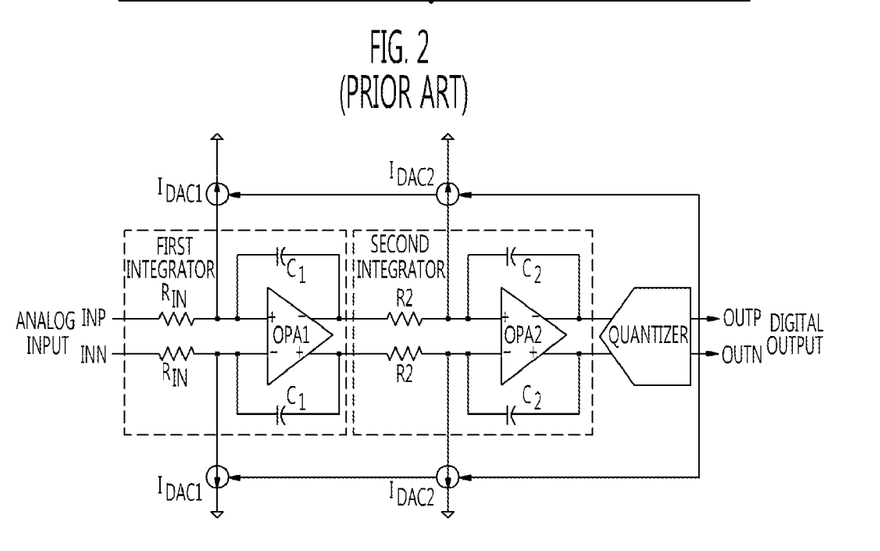
FIG. 2 is a circuit diagram illustrating a conventional continuous-time sigma-delta modulator.

FIG. 2 is a circuit diagram illustrating a conventional continuous-time sigma-delta modulator, and particularly, a continuous-time sigma-delta modulator having a secondary structure.

As illustrated, the conventional continuous-time sigma-delta modulator may include a loop filter using an active RC integrator, a quantizer, and DACs $I_{DAC1}$ and $I_{DAC2}$.

The first integrator includes input resistors $R_{IN}$, capacitors $C_1$, and an operational amplifier (OP-AMP) OPA1, and the second integrator includes resistors R2, capacitors C2, and an OP-AMP OPA2. These first and second integrators constitute the loop filter.

An output of the loop filter is converted into a digital output by the quantizer, and the digital output is fed back to the loop filter through the DACs $I_{DAC1}$ and $I_{DAC2}$. That is, the DACs $I_{DAC1}$ and $I_{DAC2}$, the OP-AMP OPA1, the capacitors C1, the resistors R2, the OP-AMP OPA2, and the capacitors C2 constitute a negative feedback loop (hereinafter, referred to as "sigma-delta modulator loop").

The continuous-time sigma-delta modulator having the above-described structure operates without a process of sampling an input signal, while the DACs transmit analog current signals to the first and second integrators in response to clock signals. Quantization noise of the quantizer is noise-shaped by the sigma-delta modulator loop so as to be reduced in the signal band, and the input signal passes through the input resistors $R_{IN}$ and the sigma-delta modulator loop, and is output without attenuation in the signal band.

Thus, compared to the discrete-time sigma-delta modulator, the continuous-time sigma-delta modulator has flexible design requirements of the amplifier, and thus can be operated with low power at a high speed.

However, the gain control function of the discrete-time sigma-delta modulator of FIG. 1 cannot be applied to the continuous-time sigma-delta modulator due to a structural difference. Further, when the DACs $I_{DAC1}$ and $I_{DAC2}$ are adjusted to control the gain of the continuous-time sigma-delta modulator, the characteristics of the sigma-delta modulator loop may vary, which leads to degrading circuit stability.

As a result, the continuous-time sigma-delta modulator should include a separate gain control circuit to control the gain of the input signal, thereby increasing power consumption.

SUMMARY OF THE INVENTION

The present invention is directed to an active resistance-capacitance (RC) integrator and a continuous-time sigma-delta modulator, which have a gain control function to reduce power consumption of an analog signal processing system that uses the continuous-time sigma-delta modulator.

One aspect of the present invention is to provide an active RC integrator, which includes: an amplifier; a first base resistor connected between a first input node and a positive input port of the amplifier; a second base resistor connected between a second input node and a negative input port of the amplifier; a first resistor unit connected between the second input node and the positive input port of the amplifier; and a second resistor unit connected between the first input node and the negative input port of the amplifier.

Another aspect of the present invention is to provide a continuous-time sigma-delta modulator, which includes: a first integrator comprising an amplifier, a first base resistor connected between a first input node and a positive input port of the amplifier, a second base resistor connected between a second input node and a negative input port of the amplifier, a first resistor unit connected between the second input node and the positive input port of the amplifier, the first resistor unit including a plurality of resistors connected in parallel and a plurality of switches configured to turn on/off the plurality of resistors, and a second resistor unit connected between the first input node and the negative input port of the amplifier, the second resistor unit including a plurality of resistors connected in parallel and a plurality of switches configured to turn on/off the plurality of resistors, respectively; and a second integrator.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will now be described more fully hereinafter with reference to the accompanying drawings, in which exemplary embodiments of the invention are shown. Descriptions of well-known components and processing techniques are omitted so as not to unnecessarily obscure the embodiments of the present invention.

Figure 3:
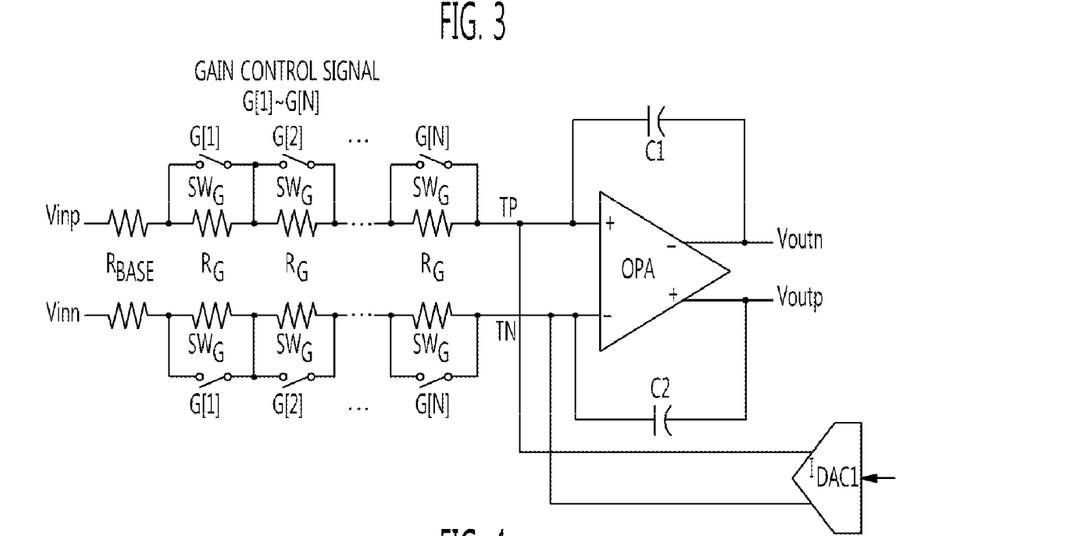
FIG. 3 is a circuit diagram illustrating an active resistance-capacitance (RC) integrator according to a first exemplary embodiment of the present invention.

FIG. 3 is a circuit diagram illustrating an active resistance-capacitance (RC) integrator having a gain control function according to a first exemplary embodiment of the present invention.

As illustrated, the active RC integrator includes base resistors $R_{BASE}$ connected between first and second input nodes Vinp and Vinn and input ports TP and TN of an operational amplifier (OP-AMP) OPA, a plurality of resistors $R_G$ connected in series between the base resistors $R_{BASE}$ and input ports TP and TN of the OP-AMP OPA, a plurality of switches $SW_G$ configured to control ON/OFF of the plurality of resistors $R_G$ respectively, and capacitors C1 and C2. A digital-to-analog converter $I_{DAC1}$ is connected to the input ports TP and TN of the OP-AMP OPA.

The active RC integrator having the above-described structure applies gain control signals G[1] to G[N] to the plurality of switches $SW_G$, and thereby can control a gain.

When the gain of the input signal is controlled by connecting the resistors in series, the ON-resistance of a switch $SW_G$, for example, a MOSFET, should be lower than a resistance of the resistors $R_G$. As such, the size of the switch $SW_G$ may be increased. However, since the voltage across the switch $SW_G$ has an input signal element due to the ON-resistances of the switches $SW_G$ connected in series, the ON-resistance of the switch $SW_G$ may vary with the voltage across the switch SW, so that signal distortion may occur.

Figure 4:
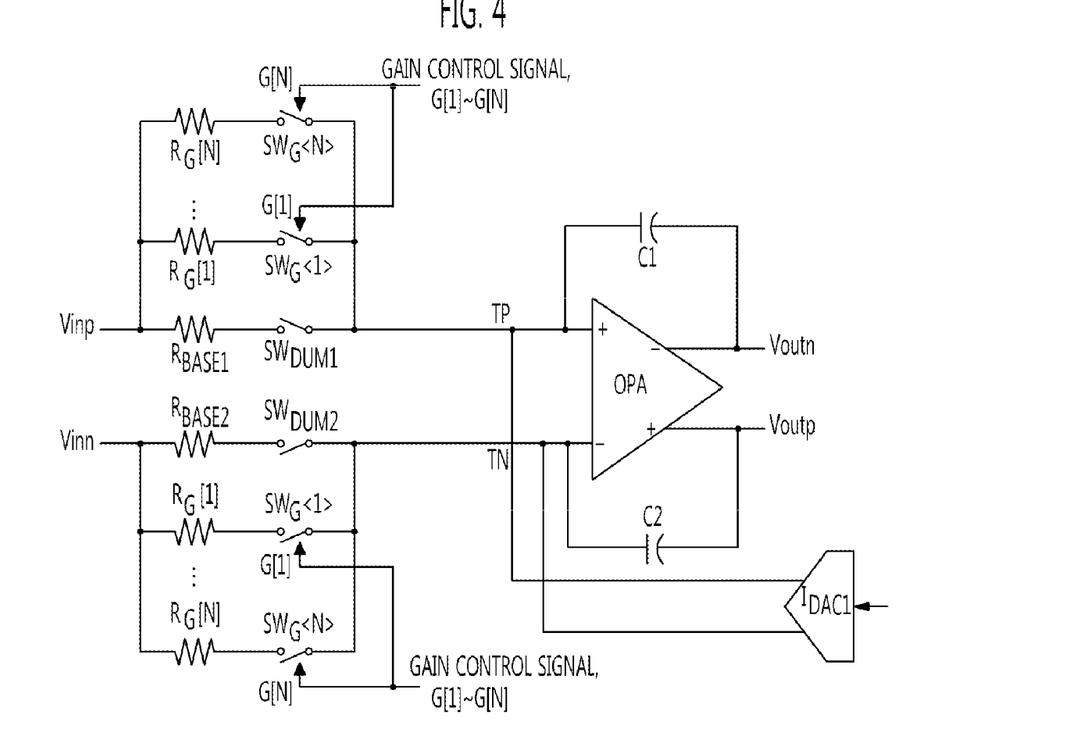
FIG. 4 is a circuit diagram illustrating an active RC integrator according to a second exemplary embodiment of the present invention.

FIG. 4 is a circuit diagram illustrating an active RC integrator according to a second exemplary embodiment of the present invention.

As illustrated, the active RC integrator includes first and second base resistors $R_{BASE1}$ and $R_{BASE2}$ connected between first and second input nodes Vinp and Vinn and positive and negative input ports TP and TN of an OP-AMP OPA, first and second switches $SW_{DUM1}$ and $SW_{DUM2}$ configured to control ON/OFF of the first and second base resistors $R_{BASE1}$ and $R_{BASE2}$, a plurality of resistors, $R_G[1]$ to $R_G[N]$ connected parallel to the first base resistor $R_{BASE1}$, a plurality of switches $SW_G[1]$ to $SW_G[N]$ configured to control ON/OFF of the plurality of resistors $R_G[1]$ to $R_G[N]$, a plurality of resistors $R_G[1]$ to $R_G[N]$ connected parallel to the second base resistor $R_{BASE2}$, a plurality of switches $SW_G[1]$ to $SW_G[N]$ configured to control ON/OFF of the plurality of resistors $R_G[1]$ to $R_G[N]$, and capacitors $C_1$ and $C_2$. A DAC $I_{DAC1}$ is connected to the input ports TP and TN of the OP-AMP OPA.

The active RC integrator having the above-described structure applies the gain control signals G[1] to G[N] to the plurality of switches $SW_G[1]$ to $SW_G[N]$, and thereby can control the gain of an input signal.

When the gain of the input signal is controlled by connecting the plurality of resistors $R_G[1]$ to $R_G[N]$ to the first and second base resistors $R_{BASE1}$ and $R_{BASE2}$ in parallel as described above, all the switches $SW_G[1]$ to $SW_G[N]$ should be turned off to minimize the gain of the input signal. Also, as the resistances of the first and second base resistors $R_{BASE1}$ and $R_{BASE2}$ increase, the gain of the input signal may decrease. However, as the resistances of the first and second base resistors $R_{BASE1}$ and $R_{BASE2}$ increase, a circuit area may increase.

Figure 5:
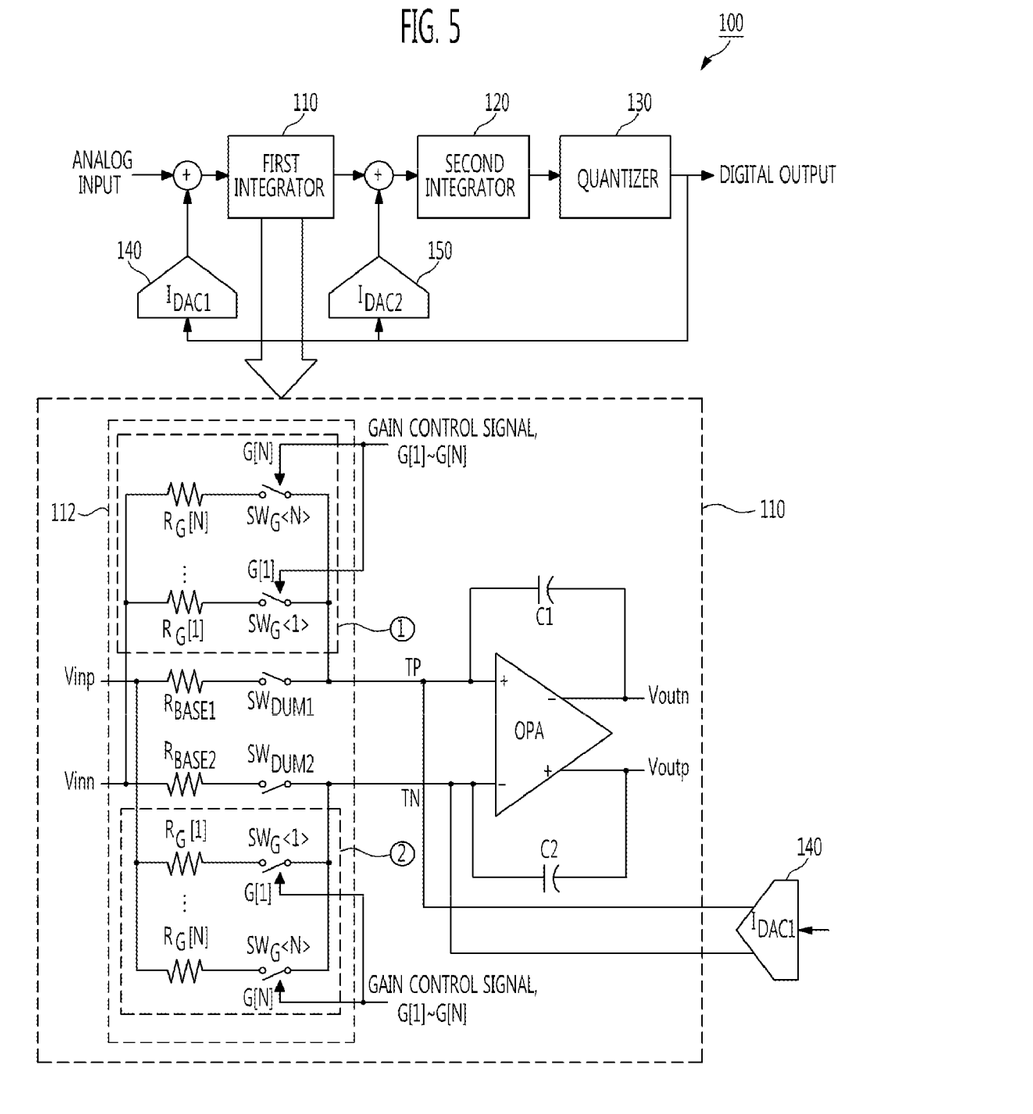
FIG. 5 is a circuit diagram illustrating a continuous-time sigma-delta modulator using an active RC integrator as a first integrator according to a third exemplary embodiment of the present invention.

FIG. 5 is a circuit diagram illustrating a continuous-time sigma-delta modulator using an active RC integrator as a first integrator according to a third exemplary embodiment of the present invention. In particular, FIG. 5 is a detailed circuit diagram of the active RC integrator.

As illustrated, a continuous-time sigma-delta modulator 100 includes a first integrator 110, a second integrator 120, a quantizer 130, and ADCs $I_{DAC1}$ (140) and $I_{DAC2}$ (150). The continuous-time sigma-delta modulator 100 employs an active RC integrator as the first integrator 110.

Further, the active RC integrator may include an OP-AMP OPA, an input resistor network 112, and integral capacitors C1 and C2. Here, the input resistor network 112 is configured to control the gain of an input signal. Specifically, the resistance of the input resistor network 112 varies in response to the gain control signals G[1] to G[N] to control the gain of the input signal. Thus, the continuous-time sigma-delta modulator 100 can have lower power consumption, compared to a conventional analog signal processing system including an additional gain control circuit.

Specifically, the input resistor network 112 includes a first base resistor $R_{BASE1}$ connected between a first input node Vinp and a positive input port TP of the OP-AMP OPA, a switch $S_{WDUM1}$ configured to turn on/off the first base resistor $R_{BASE1}$, a second base resistor $R_{BASE2}$ connected between a second input node Vinn and a negative input port TN of the OP-AMP OPA, a second switch $SW_{DUM2}$ configured to turn on/off the second base resistor $R_{BASE2}$, a first resistor unit ①  connected between the second input node Vinn and the positive input port TP of the OP-AMP OPA, and a second resistor unit ② connected between the first input node Vinp and the negative input port TN of the OP-AMP OPA.

By adding the first and second resistor units ① and ② to the input resistor network 112, current signals applied to the integral capacitors C1 and C2 of the first integrator 110 may be varied by the first and second resistor units ① and ②. In other words, when the active RC integrator is a complete differential circuit, the resistance (i.e., input resistance) of the input resistor network 112 may be varied by the first and second resistor units ① and ② to thereby control the gain of the input signal. In particular, in the active RC integrator according to the third exemplary embodiment, a small gain is easy to obtain, compared with the first and second exemplary embodiments.

For example, it is assumed that a voltage of +1 V is applied to the first input node Vinp, a voltage of −1 V is applied to the second input node Vinn, and resistance of $R_{BASE1}$ and $R_{BASE2}$ is 1 k ohm. In this case, since the positive input port TP of the OP-AMP OPA is a virtual ground (0 V), a current of 1 mA flows, but a reverse current of about −1 mA flows due to the first resistor unit ①. The first and second resistor units ① and ② are added to the input resistor network 112, so that it is possible to obtain the small gain approximate to zero (0).

In detail, the first resistor unit ① may include a plurality of parallel resistor-switch sets configured to enable the second input node Vinn to be connected with or disconnected from the positive input port TP of the OP-AMP OPA, and the second resistor unit ② may include a plurality of parallel resistor-switch sets configured to enable the first input node Vinp to be connected with or disconnected from the negative input port TN of the OP-AMP OPA. For example, each of the first and second resistor units ① and ② may include a plurality of resistors $R_G[1]$ to $R_G[N]$, which are connected in parallel, and a plurality of switches $SW_G<1>$ to $SW_G<N>$ configured to turn on/off the plurality of resistors $R_G[1]$ to $R_G[N]$, respectively.

In this structure, since the plurality of switches $SW_G<1>$ to $SW_G<N>$ are connected in series to the plurality of resistors $R_G[1]$ to $R_G[N]$ connected in parallel, the switches $SW_G<1>$ to $SW_G<N>$ are connected only to the input ports TP and TN (i.e., virtual ground nodes) of the OP-AMP OPA. Thus, it is possible to prevent the signal distortion caused by a change in voltages across the switches $SW_G<1>$ to $SW_G<N>$. Further, gain control signals G[1] to G[N] are applied to the plurality of switches $SW_G<1>$ to $SW_G<N>$ to control the plurality of resistors $R_G[1]$ to $R_G[N]$, respectively. Thereby, it is possible to vary the resistance of the input resistor network 112 using the first and second resistor units ① and ②.

Hereinafter, the operation and resultant effects of the active RC integrator according to the third embodiment will be described in detail with reference to the following Equations.

A relationship between input and output voltages of the active RC integrator according to the third embodiment can be expressed as in Equation 1 below.

$$(Voutp - Voutn) = \frac{1}{s \cdot C_1} \cdot \left\{ \frac{1}{R_{BASE}} - \frac{G[1]}{R_G[1]} - \ldots - \frac{G[N]}{R_G[N]} \right\} \cdot (Vinp - Vinn) \quad \text{Equation 1}$$

$$G[1] \sim G[N] = \begin{cases} 0 : SW \quad OFF \\ 1 : SW \quad ON \end{cases}$$

where Voutp denotes the voltage of the positive output port of the OP-AMP OPA, Voutn denotes the voltage of the negative output port of the OP-AMP OPA, Vinp denotes the voltage of the first input node, and Vinn denotes the voltage of the second input node. S denotes the Laplace operator, and C1 denotes the capacitance of the capacitor. $R_{BASE}$ denotes the resistances of the first and second base resistors, and "$R_G[1]$ to $R_G[N]$" denote the resistances of a plurality of resistors included in each of the first and second resistor units. Further, "G[1] to G[N]" denote the gain control signals. When the switches $SW_G<1>$ to $SW_G<N>$ are turned on, the gain control signals G[1] to G[N] may have a value "1." When the switches $SW_G<1>$ to $SW_G<N>$ are turned off, the gain control signals G[1] to G[N] may have a value "0."

It can be seen from Equation 1 that the gain varies depending on the gain control signals G[1] to G[N] applied to the plurality of switches $SW_G<1>$ to $SW_G<N>$, respectively. For instance, assuming that the resistors $R_G$ included in each of the first and second resistor units ① and ② have four times the resistance of each of the first and second base resistors $R_{BASE1}$ and $R_{BASE2}$ and that each of the gain control signals G[1] to G[N] is a 4-bit signal, a relationship between input and output voltages of the active RC integrator can be expressed as in Equation 2 below.

$$(Voutp - Voutn) = \frac{1}{s \cdot C_1} \cdot \frac{1}{R_{BASE}} \cdot \left\{ 1 - \frac{G[1]}{4} - \frac{G[2]}{4} - \frac{G[3]}{4} - \frac{G[4]}{4} \right\} \cdot (Vinp - Vinn) \quad \text{Equation 2}$$

It can be seen from Equation 2 that the gain of the input signal is controlled to have four levels from $$\frac{1}{s \cdot C_1} \cdot 0 \text{ to } \frac{1}{s \cdot C_1} \cdot \frac{1}{R_{BASE}}$$

in response to the gain control signals G[1] to G[4] applied to the plurality of switches $SW_G<1>$ to $SW_G<N>$, respectively. In particular, it is possible to control the gain of the input signal to have a small value of, for example, 0.

Meanwhile, Equations 1 and 2 are expressed without considering a variation in gain depending on ON-resistances of the plurality of switches $SW_G<1>$ to $SW_G<N>$ included in the input resistor network 112, i.e. resistances measured when the switches $SW_G<1>$ to $SW_G<N>$ are turned on.

However, when the ON-resistances of the switches $SW_G<1>$ to $SWG<N>$ are added to the resistances $R_G[1]$ to $R_G[N]$, there is a possibility of affecting the gain of the active RC integrator or causing an error to the gain variation depending on the gain control signals G[1] to G[N]. Thus, a relationship between input and output signals is expressed by the following Equation 3 in consideration of the resistances of the switches $SW_G<1>$ to $SW_G<N>$. In this case, the first and second switches $SW_{DUM1}$ and $SW_{DUM2}$ connected to the first and second base resistors $R_{BASE1}$ and $R_{BASE2}$ are always turned on.

$$(Voutp - Voutn) = \frac{1}{s \cdot C_1} \cdot \left\{ \frac{1}{(R_{BASE} + R_{SW.DUM})} - \frac{G[1]}{(R_G[1] + R_{SW.G})} - \ldots - \frac{G[N]}{(R_G[N] + R_{SW.G})} \right\} \cdot (Vinp - Vinn) \quad \text{Equation 3}$$

where $R_{SW \cdot DUM}$ is the ON-resistance of each of the first and second switches $SW_{DUM1}$ and $SW_{DUM2}$, and $R_{SW \cdot G}$ is the ON-resistance of each of the switches $SW_G<1>$ to $SW_G<N>$ included in the first and second resistor units ① and ②.

According to the third embodiment, since the gain of the input signal is controlled using the input resistor network 112 in which the resistors $R_G[1]$ to $R_G[N]$ are connected in parallel, the resistors $R_G[1]$ to $R_G[N]$ may be configured to have higher resistances than the switches $SW_G<1>$ to $SW_G<N>$. Thus, it can be seen from Equation 3 that even in consideration of the ON-resistances of the switches $SW_G<1>$ to $SW_G<N>$, a variation in the absolute value of the gain is minimized.

Further, it can be seen from Equation 3 that, when a resistance ratio of the first and second base resistors $R_{BASE1}$ and $R_{BASE2}$ to the resistors $R_G[1]$ to $R_G[N]$ of the first and second resistor units ① and ② is set so as to be equal to that of the first and second base switches $SW_{DUM1}$ and $SW_{DUM2}$ to the switches $SW_G<1>$ to $SW_G<N>$ included in the first and second resistor units ① and ②, the gain variation is uniformly controlled irrespective of the ON-resistances of the switches $SW_G<1>$ to $SW_G<N>$. In this case, the expression that the resistance ratios are the same means that the resistance ratios are substantially the same within an error range of the gain variation allowed in driving the active RC integrator.

For example, assuming that each of the gain control signals G[1] to G[N] is a 4-bit signal, that the resistance ratio of the first and second base resistors $R_{BASE1}$ and $R_{BASE2}$ to the resistors $R_G[1]$ to $R_G[N]$s included in the first and second resistor units ① and ② is 4 ($RG=4*R_{BASE}$), and that the resistance ratio of the first and second base switches $SW_{DUM1}$ and $SW_{DUM2}$ to the switches $SW_G<1>$ to $SW_G<N>$ included in the first and second resistor units ① and ② is 4 ($R_{SWG}=4*R_{SW\cdot DUM}$), a relationship between input and output signals of the active RC integrator can be expressed by Equation 4 below.

$$(Voutp - Voutn) = \frac{1}{s \cdot C_1} \cdot \frac{1}{(R_{BASE} + R_{SW.DUM})} \cdot \left\{1 - \frac{G[1]}{4} - \ldots - \frac{G[N]}{4}\right\} \cdot (Vinp - Vinn) \quad \text{Equation 4}$$

It can be seen from Equation 4 that, when the resistance ratios are controlled to be the same, the gain of the active RC integrator may be controlled at uniform intervals from $$\frac{1}{s \cdot C_1} \cdot 0 \text{ to } \frac{1}{s \cdot C_1} \cdot \frac{1}{(R_{BASE} + R_{SW.DUM})}$$

in response to the gain control signals G[1] to G[4]. In other words, a gain increment depending on the gain control signals G[1] to G[N] is allowed to have a uniform value.

That is, according to the third embodiment, it is possible to easily obtain a very small gain, as well as to minimize the error in the absolute value of the gain and the error in the gain variation, which are caused by the ON-resistances of the switches $SW_G<1>$ to $SW_G<N>$ using the switches $SW_G<1>$ to $SW_G<N>$ for controlling the gain of the input signal.

Figure 6:
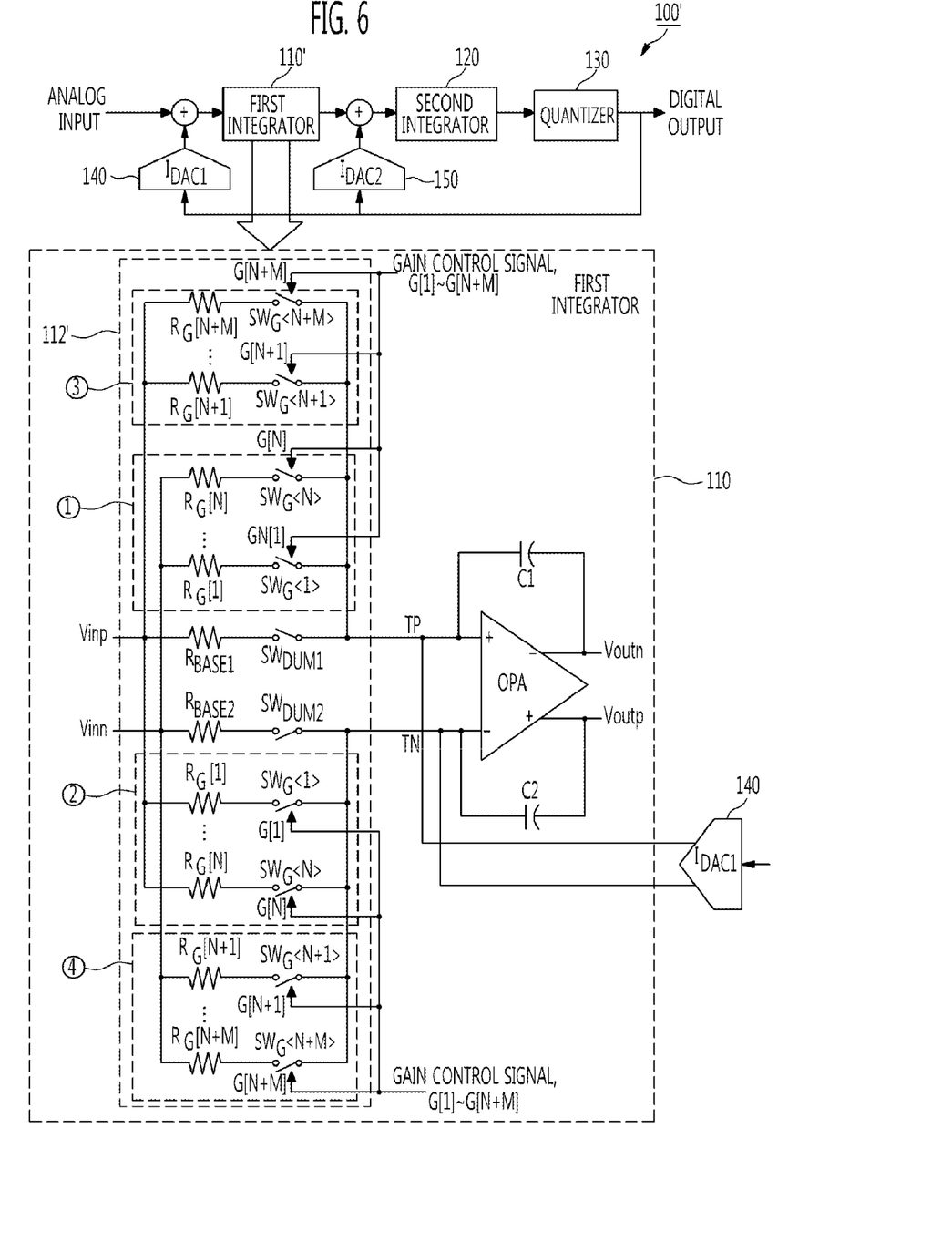
FIG. 6 is a circuit diagram illustrating a continuous-time sigma-delta modulator using an active RC integrator as a first integrator according to a fourth exemplary embodiment of the present invention.

FIG. 6 is a circuit diagram illustrating a continuous-time sigma-delta modulator using an active RC integrator as a first integrator according to a fourth exemplary embodiment of the present invention. In particular, FIG. 6 is a detailed circuit diagram of an active RC integrator.

In the fourth exemplary embodiment, reference will be made to the case where third and fourth resistor units are added to the input resistor network 112 of the third embodiment, and thus a great gain is obtained compared to when only the first and second base resistors $R_{BASE1}$ and $R_{BASE2}$ are connected to the input resistor network 113. Thus, a description of the same configuration as the third embodiment will be omitted here.

Referring to FIG. 6, the continuous-time sigma-delta modulator 100' employs an active RC integrator as a first integrator 110', and the active RC integrator includes an OP-AMP OPA, an input resistor network 112', and integral capacitors C1 and C2.

Compared to the third embodiment, the input resistor network 112' further includes a third resistor unit ③ connected between a first input node Vinp and a positive input port TP of the OP-AMP OPA and a fourth resistor unit ④ connected between a second input node Vinn and a negative input port TN of the OP-AMP OPA.

The third resistor unit ③ may include a plurality of parallel resistor-switch sets configured to enable the first input node Vinp to be connected with or disconnected from the positive input port TP of the OP-AMP OPA, and the fourth resistor unit ④ may include a plurality of parallel resistor-switch sets configured to enable the second input node Vinn to be connected with or disconnected from the negative input port TN of the OP-AMP OPA. For example, each of the third and fourth resistor units ③ and ④ may include a plurality of resistors $R_G[N+1]$ to $R_G[N+M]$, which are connected in parallel, and a plurality of switches $SW_G<N+1>$ to $SW_G<N+M>$ configured to turn on/off the plurality of resistors $R_G[N+1]$ to $R_G[N+M]$, respectively.

In this case, the resistance of the input resistor network 112' may vary depending on the gain control signals G[1] to G[N+M] applied to the plurality of switches $SW_G<N+1>$ to $SW_G<N+M>$ included in the third and fourth resistor units ③ and ④. In particular, the gain of the active RC integrator can be increased by turning on the switches $SW_G<N+1>$ to $SW_G<N+M>$.

Although the structure and operation of the secondary continuous-time sigma-delta modulator have been described with reference to FIGS. 5 and 6, this is merely for convenience of description, and the present invention is not limited thereto. Since the present invention is directed to the sigma-delta modulator using the active RC integrator as the first integrator, the present invention may be applied irrespective of the number of orders and the bit numbers of the quantizer and the ADC.

Furthermore, although the case where the active RC integrator with the gain control function is used as the first integrator of the continuous-time sigma-delta modulator has been described with reference to FIGS. 5 and 6, this is merely for convenience of description, and the present invention is not limited thereto. For example, the active RC integrator according to an exemplary embodiment of the present invention may be employed as the first integrator of the continuous-time sigma-delta modulator as well as the first integrator of the continuous-time/discrete-time hybrid sigma-delta modulator.

According to the present invention, the input resistor network whose resistance is varied is used instead of a conventional input resistor, so that it is possible to provide the active RC integrator having the gain control function. Further, it is possible to provide the continuous-time sigma-delta modulator and the discrete-time/continuous-time hybrid sigma-delta modulator, all of which use this active RC integrator as the first integrator. As a result, it is possible to realize a low-power system having lower power consumption, compared to a conventional analog signal processing system including a separate gain control circuit.

Specifically, according to the present invention, the resistor units including the plurality of resistors connected in parallel and the plurality of switches configured to turn on/off the respective resistors are added to the input resistor network, so that the resistance of the input resistor network can vary to control the gain of the active RC integrator. This structure produces the following effects. First, it is possible to obtain a very small gain of, for example, 0. Second, it is possible to provide a uniform gain increment irrespective of the ON-resistances of the switches included in the resistor unit. Third, it is possible to minimize a variation in the absolute value of the gain of the active RC integrator.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. An active RC integrator comprising:
an amplifier;
a first base resistor connected between a first input node and a positive input port of the amplifier;
a second base resistor connected between a second input node and a negative input port of the amplifier;
a first resistor unit connected between the second input node and the positive input port of the amplifier, the first resistor unit including at least one resistor and at least one switch; and
a second resistor unit connected between the first input node and the negative input port of the amplifier, the second resistor unit including at least one resistor and at least one switch,
wherein the first and second resistor units are configured to vary an input resistance to control a gain of an input signal according to control signals received by the first and second resistor units.

2. The active RC integrator of claim 1, wherein the first resistor unit is configured to enable the second input node to be connected or disconnected from the positive input port of the amplifier,
wherein the second resistor unit is configured to enable the first input node to be connected or disconnected from the negative input port of the amplifier, and
wherein the active RC integrator further comprises:
a first switch configured to turn on/off the first base resistor; and
a second switch configured to turn on/off the second base resistor.

3. The active RC integrator of claim 1, wherein each of the first and second resistor units comprises:
a plurality of resistors connected in parallel; and
a plurality of switches configured to turn on/off the plurality of resistors, respectively,
wherein the first resistor unit has a first end connected to the second input node and a second end connected to the positive input port of the amplifier, and
wherein the second resistor unit has a first end connected to the first input node and a second end connect to the negative input port of the amplifier.

4. The active RC integrator of claim 1, wherein the first and second resistor units are configured to vary an input resistance to control a gain of an input signal at uniform intervals according to the control signals received by the first and second resistor units.

5. The active RC integrator of claim 1, wherein the first and second base resistors have a first resistance ratio relative to resistors included in the first and second resistor units, and the first resistance ratio is equal to a second resistance ratio of the first and second switches to switches included in the first and second resistor units.

6. The active RC integrator of claim 1, further comprising a third resistor unit connected between the first input node and the positive input port of the amplifier.

7. The active RC integrator of claim 6, wherein the third resistor unit includes:
a plurality of resistors connected parallel to the first base resistor; and
a plurality of switches configured to turn on/off the plurality of resistors.

8. The active RC integrator of claim 1, further comprising a fourth resistor unit connected between the second input node and the negative input port of the amplifier.

9. The active RC integrator of claim 8, wherein the fourth resistor unit includes:
a plurality of resistors connected parallel to the second base resistor; and
a plurality of switches configured to turn on/off the plurality of resistors.

10. The active RC integrator of claim 1, wherein the first resistor unit includes a plurality of first resistor-switch sets, each first resistor-switch set including a resistor and a switch,
wherein the second resistor unit includes a plurality of second resistor-switch sets, each second resistor-switch set including a resistor and a switch, the resistor,
wherein the switches of the first resistor-switch set and the switches of the second resistor-switch sets are configured to receive control signals to control a gain of an input signal.

11. The active RC integrator of claim 10, wherein the resistor of each first resistor-switch set is provided between the second input node and the switch of the corresponding first resistor-switch set, the switch of the corresponding first resistor-switch set being connected to the positive input port of the amplifier, and
wherein the resistor of each second resistor-switch set is provided between the first input node and the switch of the corresponding second resistor-switch set, the switch of the corresponding second resistor-switch set being connected to the negative input port of the amplifier.

12. The active RC integrator of claim 11, further comprising:
a first integral capacitor provided between the positive input port of the amplifier and a negative output of the amplifier; and
a second integral capacitor provided between the negative input port of the amplifier and a positive output of the amplifier.

13. A continuous-time sigma-delta modulator comprising:
a first integrator comprising an amplifier, a first base resistor connected between a first input node and a positive input port of the amplifier, a second base resistor connected between a second input node and a negative input port of the amplifier, a first resistor unit connected between the second input node and the positive input port of the amplifier, the first resistor unit including a plurality of resistors connected in parallel and a plurality of switches configured to turn on/off the plurality of resistors, and a second resistor unit connected between the first input node and the negative input port of the amplifier, the second resistor unit including a plurality of resistors connected in parallel and a plurality of switches configured to turn on/off the plurality of resistors respectively; and a second integrator, wherein the first resistor unit includes at least one resistor and at least one switch, and the second resistor unit includes at least one resistor and at least one switch, and wherein the first and second resistor units are configure to vary an input resistance to control a gain of an input signal according to control signals received by the first and second resistor units.

14. An active RC integrator comprising:

an amplifier;

a first base resistor connected between a first input node and a positive input port of the amplifier;

a second base resistor connected between a second input node and a negative input port of the amplifier;

a first resistor unit connected between the second input node and the positive input port of the amplifier;

a second resistor unit connected between the first input node and the negative input port of the amplifier;

a third resistor unit connected between the first input node and the positive input port of the amplifier; and a fourth resistor unit connected between the second input node and the negative input port of the amplifier, wherein the first to forth resistor units are configured to vary an input resistance to control a gain of an input signal according to control signals received by the first to forth resistor units.

15. The active RC integrator of claim 14, wherein the first to fourth resistor units include a plurality of resistor-switch sets, wherein the plurality of resistors are connected to each other in parallel.

16. The active RC integrator of claim 14, wherein the active RC integrator is used as a first integrator of a continuous time sigma-delta modulator.

* * * * *